United States Patent [19]
Breedis et al.

[11] Patent Number: 5,209,787
[45] Date of Patent: May 11, 1993

[54] SURFACE MODIFICATION OF COPPER ALLOYS

[75] Inventors: John F. Breedis, Trumbull; George J. Muench, Hamden, both of Conn.

[73] Assignee: Olin Corporation, New Haven, Conn.

[21] Appl. No.: 812,543

[22] Filed: Dec. 23, 1991

Related U.S. Application Data

[62] Division of Ser. No. 563,766, Jul. 27, 1990, Pat. No. 5,096,508.

[51] Int. Cl.$^5$ .......................... C22C 9/00; B22D 23/00
[52] U.S. Cl. ...................................... 148/238; 148/240; 148/436
[58] Field of Search .................... 148/238, 240, 436

[56] References Cited

U.S. PATENT DOCUMENTS

| | | | |
|---|---|---|---|
| 3,615,899 | 0/1971 | Kimura | 148/13.2 |
| 4,043,839 | 8/1977 | Hartline, III et al. | 148/20.3 |
| 4,352,698 | 10/1982 | Hartley et al. | 148/4 |
| 4,412,899 | 11/1983 | Beale | 204/192 R |
| 4,436,560 | 3/1984 | Fujita et al. | 148/6 |
| 4,451,302 | 5/1984 | Prescott et al. | 148/13.1 |
| 4,500,605 | 2/1985 | Fister et al. | 148/20.3 |
| 4,643,859 | 2/1987 | Mitomo et al. | 264/65 |
| 4,656,499 | 4/1987 | Butt | 357/74 |
| 4,692,191 | 9/1987 | Maeda et al. | 148/6.2 |
| 4,693,760 | 9/1987 | Sioshansi | 148/4 |
| 4,756,791 | 7/1988 | D'Angelo et al. | 156/610 |
| 4,784,974 | 11/1988 | Butt | 357/73 |
| 4,799,973 | 1/1989 | Mahulikar et al. | 148/435 |
| 4,909,862 | 3/1990 | Tachikawa et al. | 148/238 |
| 4,961,457 | 10/1990 | Watson et al. | 164/46 |

FOREIGN PATENT DOCUMENTS

PCTGB88/0-1106  6/1989  United Kingdom .

OTHER PUBLICATIONS

Oliver et al, "The Wear Behavior of Nitrogen-Implanted Metals" appearing in Metallurgical Transactions A; vol. 15A, Dec. 1984, at pp. 2221-2229.

Encyclopedia of Material Science and Engineering, vol. 3, pp. 2412-2415 entitled "Ion-Implanted Coatings".

Primary Examiner—Upendra Roy
Attorney, Agent, or Firm—Gregory S. Rosenblatt; Paul Weinstein

[57] ABSTRACT

A composite copper alloy having a modified surface is provided. An element or combination of elements both soluble in copper and reactive with nitrogen are cast with copper or a copper alloy forming a solid state solution. The alloy is reacted with a nitride former to modify the surface. A continuous surface film is formed by heating in a nitrogen containing gas. A dispersion of nitride precipitate in a copper matrix is formed by implanting nitrogen ions.

8 Claims, 1 Drawing Sheet

SURFACE MODIFICATION OF COPPER ALLOYS

"This application is a division of application Ser. No. 07/563,766, filed Jul. 27, 1990, now U.S. Pat. No. 5,096,508.

FIELD OF THE INVENTION

This invention relates to a process for modifying the surface of a copper alloy. More particularly, discrete nitride precipitates are formed near the surface by ion implantation.

BACKGROUND OF THE INVENTION

Copper and copper alloys are widely used in electrical and electronic applications due to excellent electrical characteristics. The mechanical properties are less than ideal. Copper is relatively soft. Connectors and other electronic components are subject to frictional wear. The metal readily oxidizes and the oxides are poor conductors of electricity. The formation of oxides on the surface of a connector leads to an increase in the contact resistance which is not desirable.

Oxidation of copper can be minimized by coating with a second metal such as tin or gold. The coatings have a minimal effect on the hardness or wear resistance of the substrate.

The addition of alloying additives to copper can increase wear resistance and hardness as well as improve oxidation resistance. However, the additives usually cause a decrease in electrical conductivity.

It is therefore desirable to develop a means to increase the wear resistance, hardness and oxidation resistance of copper or a copper alloy without significantly decreasing the electrical conductivity. This goal is accomplished by surface modification.

Surface modification affects only the outer surface of the substrate. The affected depth is from a few angstroms to less than about 1 micron. Among the methods of surface modification are carburization and nitriding. Steels and titanium alloys are hardened by these processes. Surface modification generally heating the metal substrate to a temperature below the melting point in a stream of reaction gas. Alternatively, ions of the reaction gas may be implanted in the surface by ion implantation.

U.S. Pat. No. 4,693,760 issued to Sioshansi discloses a process and fixture for modifying the surface of a titanium alloy with carbon or nitrogen by ion implantation. An article by Oliver et al entitled *The Wear Behavior of Nitrogen-Implanted Metals* details how the wear characteristics of titanium alloys, a hard chromium plate and ferrous metals are improved by nitriding the surface by ion implantation.

Nitriding of copper and copper alloys to improve surface properties is difficult. The attraction between copper and nitrogen is minimal. Nitriding by conventional means does not produce significantly improved surfaces.

A boride dispersed copper alloy having improved surface properties has been produced. The process is disclosed in U.S. Pat. No. 4,436,560 to Fujita et al. A copper substrate is alloyed with a metal which reacts with boron. Alternatively, the surface of the alloy is coated with a reactive metal. Boron is then brought into contact with the surface by immersion in molten boron salt, fluid bed deposition or vapor deposition. The resultant surface has a dispersion of fine boride particles in a copper matrix. The dispersoids occupy from 1 to 50% of the surface volume.

This technique is only suitable when the precipitate former (boron) is soluble in the host matrix (copper). Nitrogen is not significantly soluble in copper. The process is not suitable for forming nitride precipitates at the surface of copper or a copper alloy.

SUMMARY OF THE INVENTION

Accordingly, it is an object of the invention to provide a copper alloy having a modified surface. It is a feature of the invention that the surface is modified by reaction with nitrogen. It is a further feature of the invention that the copper alloy includes at least one element which is both soluble in copper and reactive with nitrogen. It is a benefit of the invention that the nitrided surface may be in the form of either a continuous film or discrete particles dispersed in a copper matrix. It is a further benefit of the invention that the surface modified alloy has improved mechanical properties such as wear resistance and hardness. Yet another benefit of the invention is the modified alloy is resistant to oxidation. Still another benefit of the invention is the bulk electrical properties of the alloy remain essentially unchanged.

In accordance with the invention, there is provided a composite copper alloy. The alloy has a core CuQ where Q is at least one element both soluble in copper and reactive with nitrogen. The composite further contains a surface layer having the formula CuQN. The surface is modified by reacting the alloy with nitrogen.

The objects, features and benefits described above will be more fully described in the drawing specification which follow.

DETAILED DESCRIPTION OF THE INVENTION

Figure 1:
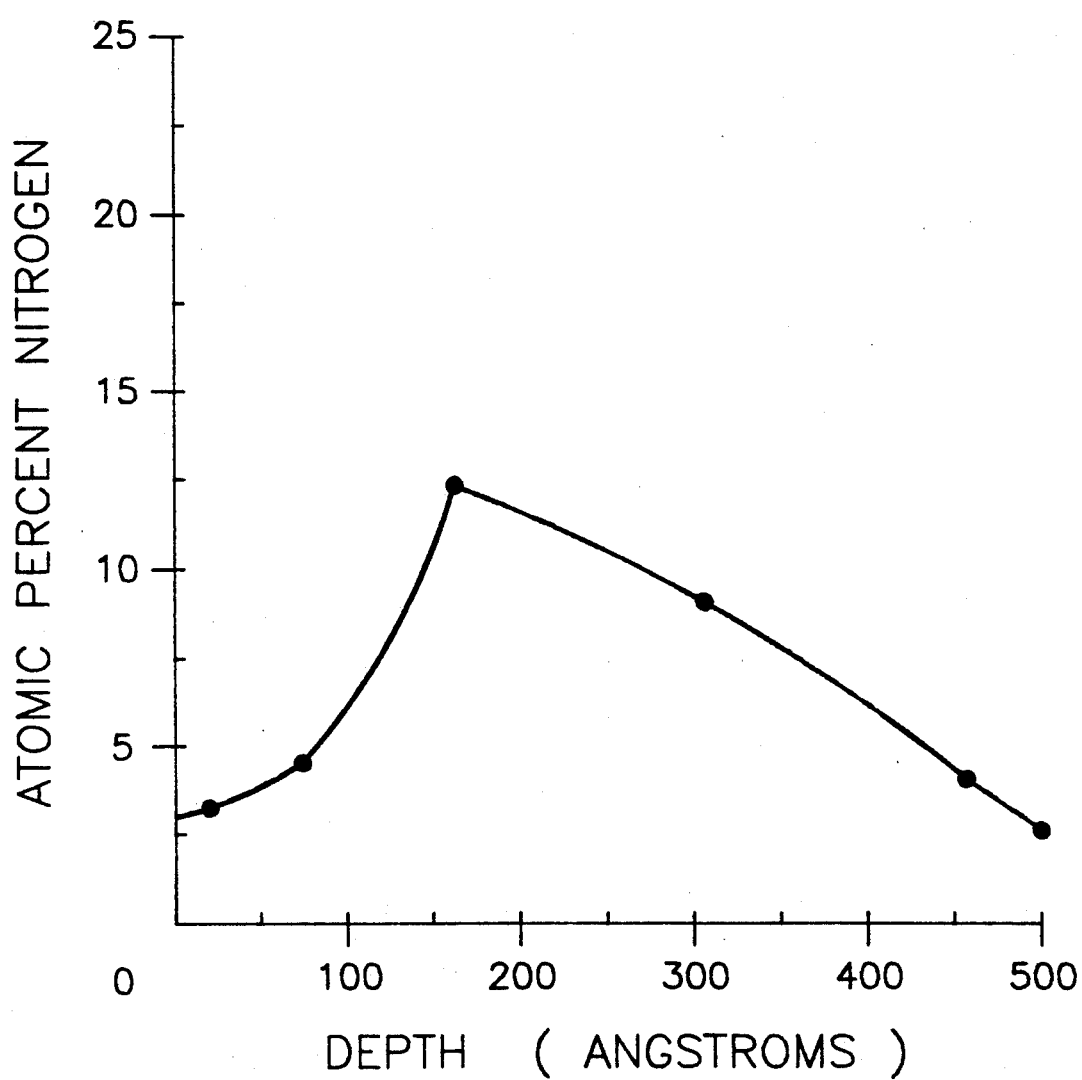
FIG. 1 shows in graphical representation the nitrogen concentration at the surface of a copper alloy formed in accordance with an embodiment of the invention.

The invention is drawn to a composite copper alloy and processes to form the composite. The composite includes a core with the general composition CuQ. A modified surface layer with the composition CuQN surrounds the core. Q is an element or combination of elements both soluble in copper and reactive with nitrogen. Preferably, when Q reacts with nitrogen, the resultant nitride is insoluble in copper. Soluble in the context of this application refers to solid state solubility. The alloying component Q chemically combines with the base component copper to form an alloy CuQ. Since QN is not soluble in the matrix, a discrete surface precipitate QN is formed in a copper based matrix.

Q is selected to improve the mechanical and thermal properties of the copper alloy. The hardness, resistance to thermally induced softening, wear resistance and oxidation resistance are improved by proper selection of the alloying element. The limitations on Q are it is soluble in copper and reactive with nitrogen. Preferred choices for the alloying element Q are titanium, aluminum, chromium, silicon and zirconium.

One preferred application of the composite alloys is electrical connectors or other electronic components. The addition of Q will reduce electrical conductivity. The core occupies the majority of the volume of the composite alloy. QN is only present in the thin surface layer. The bulk electrical properties while affected by the addition of Q are not significantly changed by nitriding. The concentration of Q should be the minimum effective to limit degradation of electrical properties.

An effective concentration of Q is that sufficient to permit the formation of a surface layer which improves the tribological and mechanical properties of the bulk alloy, while maintaining electrical conductivity at a level useful for the desired application. For electrical connector applications, the concentration of Q is preferably from about 1 to about 10 weight percent. Most preferably, the concentration of Q is from about 3 to about 6 weight percent.

The bulk alloy, CuQ is cast by conventional means such as direct chill or vacuum casting. After casting, the alloy may be further worked into a more useful form. Typically, working will include rolling to a strip of a desired thickness. The as cast alloy is homogeneous. Following working, the alloy may require annealing or other treatments to reduce microsegregation. After surface modification, the surface is either a film with the composition QN or a fine dispersion of QN precipitate in a copper matrix. When in the form of a film, the surface layer has a thickness of from about 10 angstroms to about 1 micron. More preferably, the film thickness is from about 0.1 to about 0.5 microns.

When in the form of a discrete precipitate QN, the precipitate extends into the substrate for a distance on the order of from about 10 angstroms to about 1 micron and more preferably to a depth of from about 0.01 to about 0.5 microns. The precipitate particle size is that most effective to minimize wear resistance. Typically, the cross sectional dimensions of the precipitate will be less than about 3 microns and preferably on the order of about 1 micron.

Surface modification resulting in discrete particles QN in a copper matrix are preferred over a coating QN. This is because better thermal and electrical conductivities are obtained. The wear resistance is also improved. The coating is also tougher. Nitrided films are brittle and subject to fracture. The brittle precipitate is dispersed in a ductile matrix which is more forgiving.

The copper alloys of the invention are not limited to the form CuQ. Alloys of the form CuXQ are also within the scope of the invention. X may be any element such as zinc, nickel, tin, cobalt, iron and manganese or combination of elements which are conventionally alloyed with copper. CuX is any conventional copper alloy to which the reacting element Q may be added. In this embodiment, Q is selected to be soluble in CuX and reactive with nitrogen. Preferably, the element or elements X are soluble in copper and either not reactive in nitrogen or less reactive than Q. As above, after surface modification, a composite alloy is formed. The core has the form CuXQ, while the surface may be either a film QN or a discrete QN precipitate in a CuX matrix.

The alloys of the invention are formed by casting an ingot of the form CuQ. Casting of the ingot may be by any conventional means such as direct chill casting. A desired concentration of Q is added to a heated mold containing molten copper. The mixture is then cooled to form the solid state solution CuQ. Preferably the addition step is done under a protective atmosphere or air. The additions are made by any means known in the art which will minimize the reaction between the atmosphere and the reactive element Q.

The cast ingot is then formed into a desired shape by rolling, forging or any other conventional mechanical means. For example, the ingot can be rolled down into a strip and then stamped into electrical connectors. The surface of the formed alloy is then modified by nitriding.

If a continuous QN film is desired, the substrate is placed in a nitrogen atmosphere or a nitrogen containing atmosphere, such as forming gas (96% $N_2$–4% $H_2$) or cracked ammonia, and heated to a temperature sufficient to cause reaction between the nitrogen and the reactive element Q. The substrate is held at temperature and in atmosphere for a time sufficient to form a nitriding surface layer of the desired thickness. Typically, the temperature will be close to the melting temperature of the alloy to maximize the speed of the reaction. An exemplary temperature range for an alloy Cu/1–10 wt. % Q is from about 600° to about 1000° to form a nitride film QN. A dwell time of from about 10 to about 60 minutes at temperature is suitable. The substrate is then cooled in the nitrogen atmosphere to prevent oxidation. The resulting composite alloy has a core CuQ or CuXQ and a surface film QN.

For many applications, this process is not preferred. Heating the alloy to temperatures close to melting anneals the alloy. In electrical connector applications, spring temper or other hard tempers are desired. Hot gas nitriding requires additional heat treatment steps to return to the desired temper. Certain tempers, such as disclosed in U.S. Pat. No. 4,799,973 to Mahulikar et al have a crystalline grain structure developed by a combination of cold working and heat treating. Cold working subsequent to forming the surface film is difficult or impossible.

A more preferred process is to surface treat the CuQ or CuXQ substrate by ion implantation. Ion implantation is a technique that involves the injection of high velocity ions into the surface layers of a target substrate. The ions are extracted from a suitable source, accelerated to high energies (typically 20–200 KeV) mass analyzed to produce a pure beam and then directed at the substrate in a vacuum chamber. The ions penetrate the substrate surface and come to rest at a depth typically from about 0.001 to about 0.1 micron below the surface and form a surface alloy layer.

Nitrogen ions, originating from a nitrogen vapor source, are injected into the CuQ substrate. The nitrogen reacts with Q forming a nitride precipitate. The precipitate concentration, location and size will depend on alloy concentration, concentration (dose and dose rate) of nitrogen, energy of the ions and temperature of the alloy. If desired, heat treatments may be given to the alloy subsequent to implanatation. Since only the surface is modified by this process and the alloy need not be significantly heated as with gas nitriding, the bulk microstructure remains essentially intact during surface modification. This is a distinct advantage over the gas nitriding process described above.

For plasma source ion implantation (PSII), suitable parameters for nitriding an alloy CuQ or CuXQ by ion implanatation include a nitrogen plasma density of about $1.5 \times 10^9$ ions/cm$^3$ for a time of about 105 minutes. The ions are energized to an electron voltage of about 50 KeV. The alloy is at room temperature.

Other forms of ion implanatation such as beam line may also be employed. The parameters are adjusted accordingly to achieve the desired precipitate size and depth of penetration.

The composite alloy so produced has a core of CuQ or CuXQ alloy. A surface layer having a thickness of from about 0.01 to about 0.5 microns contains a dispersion of QN precipitates in a Cu or CuX matrix. As detailed above, Q is any element which forms a solid state solution with copper and is reactive with nitrogen. Preferred elements for Q are titanium, aluminum, chromium, silicon and zirconium.

EXAMPLE 1

A copper/3% by weight titanium strip was nitrided in a tube furnace under flowing nitrogen gas. After purging the system, strips were placed in the furnace, heated to 900° C. and held for 2 hours. The strip was then cooled to 600° C. and held at temperature for 1 hour, then cooled to room temperature. The 600° C. thermal soak is believed to form a $Cu_7Ti_2$ intermetallic. It was further expected an intermetallic would precipitate further increasing the hardness of the alloy.

Following nitriding, the hardness of the strip was measured using a Vickers hardness tester with a 300 gram load. The nitrided strip had a hardness of 241 Vickers. The surface layer was then removed by sanding with 240 grit paper. The core had a hardness of 128 Vickers.

The thickness of the surface layer was measured. Electron microscopy indicated the thickness was about 1 micron.

EXAMPLE 2

A copper alloy containing 5 percent by weight aluminum substrate was fully annealed to a soft temper. The substrate was cleaned by mechanical polishing with 600 grit paper followed by buffing. The coupons were polished in a mixture of 4 parts nitric acid: 5 parts phosphoric acid: 1 part hydrochloric acid and then rinsed in water and methanol dried. The cleaned samples were placed in an ion implantation chamber and sputter cleaned with Argon. The samples were implanted at an energy of 50 KeV and a dose of $3 \times 10^{17}$ ions/cm$^2$. The implantation time was 104 minutes. The sample was not heated during ion implantation.

Electron Spectroscopy for Chemical Analysis (ESCA) depth profiling of the sample confirmed the presence of nitrogen as a surface layer as shown in FIG. 1. The nitrogen concentration reached a peak at a depth of about 150 angstroms and was still present to a limited degree at a depth of 450 angstroms inside the surface. The peak nitrogen concentration was about 11 atomic percent. The nitrogen is believed to be present at the surface as AlN precipitate.

Hardness testing using a Knoop hardness tester with loads of from 1 to 10 grams showed the implanted samples to have a 10 to 15% increase in hardness over control samples. While an improvement, the observed hardness increase is not as significant as expected. Wear testing was by a pin having a 3 millimeter ruby ball under various weights of from 20 to 200 grams. The tests were run for 30 minutes. No noticeable change in wear properties between the implanted and unimplanted samples was observed.

The minimal improvement in wear characteristics and hardness are believed related to the low concentration aluminum nitride precipitates at the surface. It is believed increasing the aluminum nitride precipitate concentration at the surface will lead to greatly improved wear and hardness properties.

Both films and discrete precipitates of QN may be formed according to the processes of the invention. The selection of nitride form is based on desired end properties. If oxidation resistance is a major concern, then a film is preferred. If wear resistance or electrical conductivity is most important, a discrete precipitate is preferred.

The publication and patents set forth in the application are intended to be incorporated by reference herein.

It is apparent that there has been provided in accordance with this invention copper alloys having a nitrided surface and process for the manufacture of the alloys which fully satisfy the objects, means and advantages set forth herein above. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A multi-phase copper alloy comprising;
   a copper alloy matrix CuQ where Q is an element or combination of elements both soluble in copper and reactive with nitrogen;
   and a second phase precipitate QN intragranularly dispersed within said copper alloy matrix.

2. The copper alloy of claim 1 wherein Q is selected from the group consisting of titanium, aluminum, chromium, zirconium, silicon and mixtures thereof.

3. The copper alloy of claim 2 wherein the concentration of Q is from about 1 to about 10 weight percent.

4. The copper alloy of claim 3 wherein the concentration of Q is from about 3 to about 6 weight percent.

5. The copper alloy of claim 3 wherein the average cross sectional dimension of said second phase precipitate is under about 3 microns.

6. The copper alloy of claim 5 wherein the average cross sectional dimension of said second phase precipitate is about 1 micron.

7. The copper alloy of claim 5 further including X, an element or combination or combination of elements soluble in copper and essentially non-reactive with nitrogen such that said copper alloy matrix is CuXQ and said second phase precipitate is QN.

8. The copper alloy of claim 7 wherein X is selected from the group consisting of zinc, nickel, tin, cobalt, iron, manganese and mixtures thereof.

* * * * *